United States Patent [19]

Gornati et al.

[11] Patent Number: 4,803,381
[45] Date of Patent: Feb. 7, 1989

[54] BIAS CURRENT COMPENSATING CIRCUIT, PARTICULARLY FOR SAW-TOOTH WAVE GENERATORS

[75] Inventors: Silvano Gornati, Casorezzo; Roberto Viscardi, Lissone; Silvano Coccetti, Vittuone, all of Italy

[73] Assignee: SGS Microelettronica S.p.A., Catania, Italy

[21] Appl. No.: 55,952

[22] Filed: Jun. 1, 1987

[30] Foreign Application Priority Data

Jun. 18, 1986 [IT] Italy ................ 20836 A/86

[51] Int. Cl.[4] .............. H03K 4/08; H03K 17/56; H03K 4/10; G05F 3/16
[52] U.S. Cl. ................... 307/228; 307/263; 307/246; 328/183; 328/185; 323/315; 323/317
[58] Field of Search ............ 307/228, 270, 491, 246, 307/263, 296.1, 296.6; 328/181, 182, 183, 184, 185; 323/315, 317

[56] References Cited

U.S. PATENT DOCUMENTS

| | | | |
|---|---|---|---|
| 4,009,398 | 2/1977 | Yamada et al. | 328/181 |
| 4,047,052 | 9/1977 | Koubek et al. | 328/185 |
| 4,626,702 | 12/1986 | Chito | 307/228 |

FOREIGN PATENT DOCUMENTS 0050733  4/1980  Japan .................. 307/263

*Primary Examiner*—Stanley D. Miller
*Assistant Examiner*—Trong Q. Phan
*Attorney, Agent, or Firm*—Guido Modiano; Albert Josif

[57] ABSTRACT

This circuit comprises a current source stage connectable to a capacitor which is controlled so as to alternately and periodically charge with the current fed by the source stage and discharge through a switch element, so as to generate a saw-tooth wave voltage. A buffer circuit, with low-impedance output is connected to the capacitor, for feeding a saw-tooth shaped low-impedance voltage signal to a load. In order to prevent the bias current of the buffer stage from introducing an error in the capacitor charge current and in the frequency of the saw-tooth voltage, a current sensor is provided connected between the buffer stage and the current source stage so as to vary the current generated by the source stage in an equal but opposite manner with respect to the error current due to the buffer stage.

5 Claims, 1 Drawing Sheet

4,803,381

BIAS CURRENT COMPENSATING CIRCUIT, PARTICULARLY FOR SAW-TOOTH WAVE GENERATORS

BACKGROUND OF THE INVENTION

The present invention relates to a bias current recovery circuit, in particular for saw-tooth wave generators.

As is known, saw-tooth wave generators are circuits which generally comprise a current source stage (usually a current mirror) which is controlled from the outside by a settable value current source and which feeds a capacitor also connected to a control element, typically a transistor, which is switched on by short pulses (see for example figure 1). Accordingly, during the phase in which the transistor is OFF, the current mirror circuit feeds the set current to the capacitor which is thus charged in a linear manner, while during the short intervals with the control transistor in the ON state discharge of the capacitor occurs through said transistor. With such a circuit, the operating frequency is in practice controlled by the equation $$I t = C \Delta V$$

wherein
I is the capacitor loading current through the current source stage, C is the capacitance of the capacitor, $\Delta V$ is the voltage variation across the capacitor, while t is the charge time which in practice coincides with the period T since discharge is much faster than charge.

Moreover, as is known, in saw-tooth wave generator circuits for the Y-axis used in data displays, the performance as to precision and temperature stability must be better with respect to circuits of other types, in particular with respect to standard television circuits. In particular, for designing a saw-tooth wave generator with a period T comprised between 10 and 20 ms, using a capacitor C=100–200 nF it is necessary to charge this capacitor with a current having a rather small value, and then discharge it with a relatively high current so as to achieve the required saw-tooth shape. In data display circuits, the value of the capacitor which appears in the above equation is determined by the requirements of good temperature stability, low tolerance on the nominal value and naturally not too high cost, which are fundamental for the application being considered. Accordingly, to obtain a precise operating frequency it is necessary for the current I supplied to the capacitor through the current source circuit to be exactly equal to the one which loads the capacitor in a linear manner. On the subject it should be stressed that, due to the values of the variables involved in the above mentioned equation, the current I is comprised between 10 and 100 $\mu$A, and is therefore rather small and as such is particularly responsive to external influences which can thus vary the operating frequency of the circuit in its entirety.

In fact, the high impedance signal present across the capacitor is fed to the downstream user stages by means of a separator circuit or buffer with a low-impedance output, so that these stages can use it and process it as required. However, the buffer stage (also illustrated in FIG. 1) introduces an error in the charge current fed to the capacitor due to its bias current. Typically, the error caused by the buffer stage is due to the base current of a PNP or NPN transistor which is added to or subtracted from the current supplied by the source stage and, due to the low value of the currents, considerably affects the charging slope of the capacitor and thus, finally, the frequency of the signal obtained.

The problem is furthermore increased by the fact that said base current does not remain constant as the temperature increases, but varies with it due to the temperature dependence of the current gain $h_{fe}$, which generates a frequency drift.

To solve the problem of the error introduced by the bias current of the buffer stage on the operating frequency of the generator circuit, attempts have been made, for example, to design the buffer stage as a pair of transistors connected to one another in the Darlington configuration, thereby reducing the influence of the base current on the charge capacitor. However, this solution has not proved satisfactory due to the residual error introduced by the base current of the Darlington and most of all to the fact that in any case this current is still responsive to temperature variations, which case a frequency variation according to the operating temperature of the circuit.

SUMMARY OF THE INVENTION

Given this situation, the aim of the present invention is to provide a bias current recovery circuit, in particular for saw-tooth wave generators, which eliminates the disadvantages of the prior art.

Within this aim, a particular object of the present invention is to provide a recovery circuit compensating the error introduced by the base current of the buffer stage, thus obtaining a correct relationship between externally set current and capacitor charge current.

Another object of the present invention is to provide a recovery circuit with compensation of the frequency variations with the operating temperature.

Still another object of the present invention is to provide a circuit which is conceptually simple, requires the use of a small number of components and can be integrated without difficulty making use of methods and machines known in the field, so as to have production costs which are comparable to the ones of known circuits.

The above aim and objects, which will become apparent hereinafter, are achieved by a bias current compensation circuit, in particular for saw-tooth wave generators, comprising a controllable current source stage for feeding an adjustable value charge current to an external element, in particular a capacitor, a control element for connection to the capacitor for alternately and periodically controlling charging and discharging of the capacitor and a buffer stage, for connection to the capacitor and for receiving therefrom a saw-tooth wave voltage generated by the capacitor during charging and discharging thereof, said buffer stage receiving from or supplying to the capacitor an error current, characterized by a current sensor connected to said buffer stage and said source stage for detecting said error current supplied to or received from capacitor and for reducing or respectively increasing the current generated by said source stage by an amount substantially equal to the value of the detected error current.

BRIEF DESCRIPTION OF THE DRAWINGS

Further features and advantages of the invention will become apparent from the description of a preferred, but not exclusive, embodiment, illustrated only by way of nonlimitative example in the accompanying drawings, where.

DESCRIPTION OF THE PREFERRED EMBODIMENTS

Figure 1:
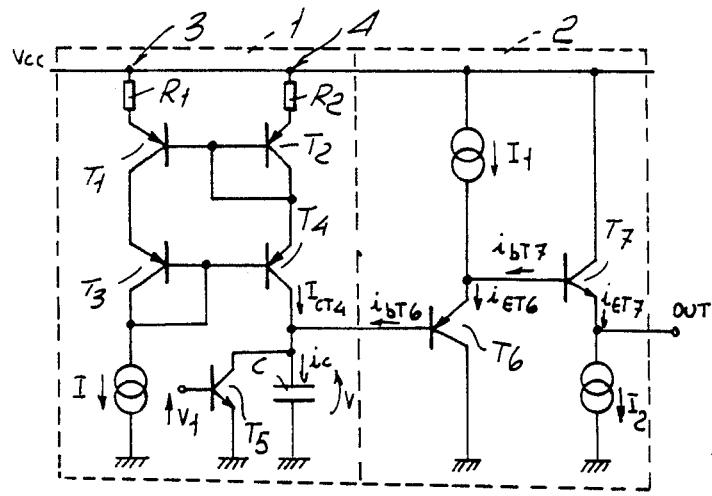
FIG. 1 is a simplified general circuit diagram of a known generator.

Reference should first be made to FIG. 1, illustrating a known generator.

As can be seen, the circuit substantially comprises two stage, and more precisely a saw-tooth voltage source stage 1, and a buffer stage 2, connected downstream to the preceding one, acting as a separator to supply at the output the low-impedance saw-tooth signal required for use in data displays.

Figure 2:
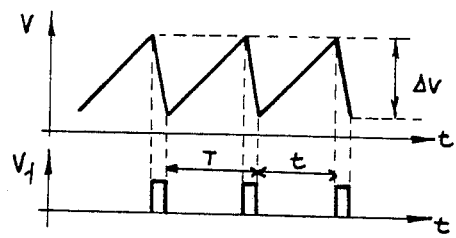
FIG. 2 illustrates the capacitor voltage and the switch control voltage versus time.

In detail, the circuit comprises an external current source I connected to the control branch 3 of a current mirror circuit made here by the transistors $T_1$-$T_4$. As is known, in a current mirror circuit of this kind, the current set through the (typically external) source I and fed to the control branch 3, is mirrored through the controlled branch 4 and supplied to the capacitor C furthermore connected to a control transistor $T_5$. The transistor $T_5$ is controlled on its base terminal by a threshold switch through a synchronization stage with a signal indicated at $V_1$ and illustrated in FIG. 2. Accordingly, when the transistor $T_5$ is in the OFF state, the capacitor receives the charge current set through the source I and fed by the controlled branch 4, so as to charge in a linear manner, while with a pulse on the base of the transistor $T_5$, the latter switches on, causing the rapid discharge of the capacitor C through the same transistor $T_5$, so as to obtain the waveform illustrated at V in FIG. 2. In the absence of the buffer stage 2, the charge time t and therefore the total period T which in practice coincides with the first (in the figure the duration of the control pulse of the transistor $T_5$ has been over-emphasized) are determined by the above indicated equation. However, according to the prior art the buffer stage 2 which, in the simplified example of FIG. 1, consists of a PNP transistor $T_6$, connected with its base to a terminal of the capacitor C, and of an NPN transistor $T_7$, connected with its base to the emitter of $T_6$, introduces an error. In fact the bias current of $T_6$ sums itself to the current supplied by the current mirror, introducing an error in the operating frequency, the quantity of this error furthermore varying as the operating temperature varies.

Figure 3:
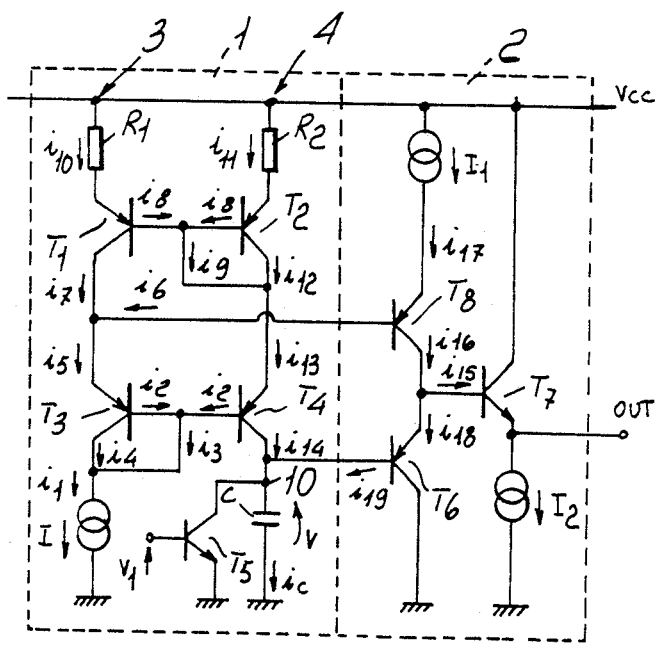
FIG. 3 is a general circuit diagram of the generator circuit according to the invention.

Reference should now be made to FIG. 3, illustrating one embodiment of the invention. In detail, the circuit of FIG. 3 generally coincides with the one according to the prior art, except for the provision of a current sensor connected to the buffer stage so as to detect the bias current of the latter and furthermore connected to the current mirror stage, to cause a corresponding and reverse variation in the current supplied by the current mirror itself, so as to compensate the error caused by the buffer circuit.

Thus, in FIG. 3 the parts corresponding to the circuit of FIG. 1 have been indicated by the same reference numerals. In detail, the circuit comprises an external current source I which controls a current mirror formed by the transistors $T_1$-$T_4$. Specifically, the transistor $T_1$ is connected with its emitter terminal to the supply voltage Vcc through a resistor $R_1$, and with its base terminal to a further transistor $T_2$ also connected to the supply voltage Vcc through the resistor $R_2$. Furthermore, the transistor $T_2$ is diode connected due to the shorting connection between its base and its collector. The transistor $T_1$ is moreover connected with its collector terminal to the emitter terminal of a further transistor $T_3$ which forms, with the transistor $T_1$, the control branch of the current mirror. The transistor $T_3$ is then connected with the collector terminal to the current source I and is diode configured due to the shorting connection between its base terminal and its collector terminal.

Moreover, $T_3$ is connected with the base terminal to the base of the transistor $T_4$ which in turn has the emitter terminal connected to the collector of $T_2$, so as to form with the latter the controlled branch 4 of the current mirror. The collector of $T_4$ is connected to a terminal of the external capacitor C, and the latter with the same terminal is connected to a switch element, typically a transistor $T_5$ receiving at the base the switching control signal $V_1$ illustrated in FIG. 2. The capacitor C is furthermore connected with the same terminal to the buffer stage 2 comprising a pair of transistors $T_6$ and $T_7$. Here the transistor $T_6$ consists of a PNP transistor having the collector terminal connected to ground and the emitter terminal connected to the base of the NPN transistor $T_7$. In turn the collector of $T_7$ is connected to the supply voltage while its emitter is connected to a current generator $I_2$ and to the output supplying therefore the sawtooth signal generated by the capacitor, but at low impedance for the control of the downstream processing circuits. The buffer stage 2 furthermore has a current generator $I_1$ and, according to the invention, a current sensor here formed by the additional transistor $t_8$, of the PNP type, connected with the emitter terminal to the generator $I_1$ and with the collector terminal to the emitter of $T_6$ and to the base of $T_7$, while the base of $T_8$ is connected to the control branch 3 of the current mirror at the connection point between the collector of $T_1$ and the emitter of $T_3$.

The circuit according to the invention operates as follows. The current I set by the external current source is mirrored by the current mirror circuit $T_1$-$T_4$ and used to charge the external capacitor C which is then rapidly discharged when the voltage across it has reached a set value. In particular the actual current mirror, formed by the transistors $T_1$, $T_2$ and $T_4$, is provided in a Wilson configuration to which the transistor $T_3$ has been added, diode connected, to cause the transistors $T_1$ and $T_2$ (which perform current mirroring) to operate at the same operating conditions and therefore with the same collector to emitter voltage $V_{CE}$. The transistors $T_6$ and $T_7$ transfer on a lowimpedance point the saw-tooth wave present on the terminal 10 of the capacitor C, making it available to the circuits connected to the output OUT. To this end, the operation of the device according to the invention is the same as the known circuit of FIG. 1. However, according to FIG. 3, the current supplied to the capacitor C is not the same as FIG. 1 by virtue of the current sensor $T_8$ which compensates the effects of the buffer stage 2. In fact, as a first approximate, neglecting the base current $T_7$, the transistors $T_6$additional transistor $T_8$ are flown by the same current. In detail, indicating by $I_{E6}$ the emitter current of the transistor $T_6$, the current flowing through transistor $T_8$ is equal to $$I_{E6} = \alpha \cdot I_{E8}, \text{ with } \alpha = \frac{\beta}{\beta + 1}$$

With $\beta$ equal to 100, for example $I_{E6}=0.99\,I_{E8}$ is obtained. It is therefore reasonable to suppose that the transistors $T_6$ and $T_8$ operate with the same base current. In practice, the additional transistor $T_8$ injects on the control branch 3 of the current mirror (and precisely on the collector of $T_1$) a base current equal to the current supplied by the buffer stage formed by $T_6$ and $T_7$ to the outer capacitor. Thereby the transistors $T_1$ and $T_2$ supply a current which is lower than I by the current injected by the current buffer, that is, the mirrored current is smaller than the preset value I by exactly the amount which is then added thereto by the base current of $T_6$. Consequently, a current is supplied to the capacitor which is equal to the current preset by the external source I, with the error due to the base current of $T_6$ being eliminated and compensated by the corresponding reduction of the current mirrored in the mirror $T_1$-$T_4$. In this manner, therefore, there is a practically complete compensation of the error introduced by the buffer stage, which compensation is correlated to the error itself and therefore varies as the temperature varies, thus eliminating the influence of the temperature on the output frequency.

Hereinafter a numeric example is given, for a better illustration of the advantages of the invention.

Suppose the external current source I supplies a current of 50 µA and the sources $I_1$ and $I_2$ each supply a current of 200 µA, and also that the NPN transistors have a $\beta$ of 100 and the PNP transistors have a $\beta$ of 50. In such conditions, in the circuit of FIG. 1;

$$i_{bT7} = \frac{i_{ET7}}{\beta_7 + 1} = \frac{200\mu A}{101} \approx 2\mu A$$

$$I_{bt6} = \frac{i_{ET6}}{\beta_6 + 1} = \frac{200 + 2}{51} = 3{,}96\mu A$$

Since $$I_{CT4} = I = 50\ \mu A$$

it follows that $$i_c = I_{CT4} + i_{bTb} = 53{,}96\ \mu A$$

equivalent to an error with respect to the set nominal reference current of:

$$e = \frac{i_c - I}{I} \cdot 100 = 7{,}92\%.$$

The following relations are instead true regarding the circuit of FIG. 3, according to the invention:

$$i_1 = I$$

$$i_3 = 2i_2$$

$$i_4 = i_1 - 2i_2 = I - 2i_2$$

$$i_5 = i_4 + i_2 = I - i_2$$

$$i_7 = i_5 - i_6 = I - i_2 - i_6$$

$$i_{10} = i_7 + i_8 = I - i_2 - i_6 + i_8$$

$$i_{11} = i_{10} = I - i_2 - i_6 + i_8$$

$$i_{12} = i_{11} - i_8 = I - i_2 - i_6$$

$$i_9 = 2i_8$$

$$i_{13} = i_{12} + i_9 = I - i_2 - i_6 + 2i_8$$

$$i_{14} = i_{13} - i_2 = I - 2i_2 - i_6 + 2i_8$$

Supposing that in the current mirror $i_2 = i_8$, it follows that $$i_{14} = I - i_6$$

$$i_{19} \approx i_6$$

$$i_c = i_{14} + i_{19} = I - i_6 + i_6 = I$$

introducing numeric values and supposing that the sources I, $I_1$, $I_2$ have the same values of the preceding example, and that the transistors have a $\beta$ of 50 if of the PNP type and of 100 if of the NPN type, the following is obtained:

$$i_{15} = \frac{I_2}{\beta_7 + 1} = \frac{200\mu A}{101} \approx 2\mu A$$

$$i_{16} = \alpha_8 i_{17} = \frac{\beta_8}{\beta_8 + 1} I_1 = 196\mu A$$

$$i_6 = \frac{i_{16}}{\beta_8} = 3.92\mu A$$

$$i_{19} = \frac{i_{18}}{\beta_6 + 1} = \frac{i_{16} - i_{15}}{\beta_6 + 1} = \frac{196 - 2}{51} \mu A = 3.80\mu A$$

$$i_{14} = I - i_6 = 50 - 3.92\mu A = 46.08\mu A$$

$$i_c = i_{14} + i_{19} = 46.08 + 3.80\mu A = 49.88\mu A$$

In this case, therefore, the current fed to the capacitor C has an error, with respect to the set reference current, equal to $$e_1 = \frac{i_c - I}{I} \cdot 100 = -0.24\%$$

As can be seen, the error is now approximately 30 times smaller than the preceding case.

As can be noted from the preceding description, the invention fully achieves the intended aims. In fact, as has been proved, with the current sensor according to the invention it is possible to practically fully compensate the bias current of the buffer circuit, so that the residual error at the output and therefore on the operating frequency of the capacitor and, finally, of the sawtooth voltage generated thereby can be kept at extremely small levels.

A further important advantage of the invention resides in the fact that the current sensor follows the variations of the current of the buffer stage according to corresponding temperature variations so that in any case the small error still existing with the circuit according to the invention does not vary as the operating temperature varies.

The circuit described is extremely simple since, with respect to the prior art, it merely requires a transistor, which can therefore be easily integrated into the structure without additional costs for the overall circuit.

The invention thus conceived is susceptible to numerous modifications and variations, all of which are within the inventive concept. In particular, instead of the additional transistor $T_8$ it is possible to use any other element capable of detecting the current flowing through the transistor $T_6$ of the buffer and to correspondingly act on the current mirror to vary the current supplied thereby.

It should be furthermore noted that, though the recovery circuit proposed has been described with reference to the use in a saw-tooth wave generator, it can be used in all the cases requiring compensation of the error introduced by the bias current in generator stages of the type described, and in particular composed of a current mirror.

Moreover, all the details may be replaced with other technically equivalent elements.

We claim:

1. Bias current compensating circuit, in particular for saw-tooth wave generators, comprising a controllable current source stage, for feeding an adjustable value charge current to an external element, in particular a capacitor, a control element connected to the capacitor for alternately and periodically controlling charging and discharging of the capacitor, a buffer stage connected to the capacitor and for receiving therefrom a saw-tooth wave voltage generated by the capacitor during charging and discharging thereof, said buffer stage supplying to the capacitor an error current, a current sensor connected to said buffer stage for detecting said error current supplied to the capacitor and for generating an error current amplitude signal, and means connected between said current sensor and said controllable current source stage for reducing said adjustable value charge current generated by said controllable current source stage by an amount substantially equal to said error current amplitude signal.

2. Circuit according to claim 1, wherein said controllable current source stage comprises a current mirror circuit having a control branch connected to a control current source and a controlled branch connected to the capacitor, with said sensor being connected to said control branch of said current mirror circuit for injecting in said control branch a current having an amount equal to said error current amplitude signal.

3. Circuit according to claim 1, wherein said controllable current source stage comprises a current mirror circuit having a control branch connected to a control current source and a controlled branch for connection to the capacitor, said buffer stage comprises at least one buffer transistor connected with a base terminal thereof to said controlled branch of said current mirror circuit, and said current sensor comprises an additional transistor connected with the emitter terminal to the generator of said buffer stage and the collector terminal to said buffer transistor and having a base terminal connected to said control branch of said current mirror circuit.

4. Circuit according to claim 3, wherein said control branch of said current mirror circuit comprises a first pair of transistors including a first and a second transistors, said first transistor being diode connected and having an emitter terminal connected to a collector terminal of said second transistor and forming therewith a common point and said controlled branch comprises a second pair of transistors including a third and a fourth transistors, said third transistor having an emitter terminal connected to a collector terminal of said fourth transistor, the base terminals of said third and fourth transistors being respectively connected to base terminals of said first and second transistors, said fourth transistor being diode connected, a base terminal of said additional transistor of said current sensor being connected to said common point between said first and second transistors.

5. Bias current compensating circuit, in particular for saw-tooth wave generators, comprising a controllable current source stage, for feeding an adjustable value charge current to an external element, in particular a capacitor, a control element connected to the capacitor for alternately and periodically controlling charging and discharging of the capacitor, a buffer stage connected to the capacitor and for receiving therefrom a saw-tooth wave voltage generated by the capacitor during charging and discharging thereof, said buffer stage receiving from the capacitor an error current, a current sensor connected to said buffer stage for detecting said error current received from the capacitor and for reducing or respectively generating an error current amplitude signal, and means connected between said current sensor and said controllable current source stage for increasing said adjustable value charge current generated by said controllable current source stage by an amount substantially equal to said error current amplitude signal.

* * * * *